(12) United States Patent
Inada

(10) Patent No.: US 10,453,868 B2
(45) Date of Patent: Oct. 22, 2019

(54) DISPLAY APPARATUS

(71) Applicant: Innolux Corporation, Miao-Li County (TW)

(72) Inventor: Toshiya Inada, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 0 days.

(21) Appl. No.: 15/910,031

(22) Filed: Mar. 2, 2018

(65) Prior Publication Data

US 2019/0273095 A1    Sep. 5, 2019

(51) Int. Cl.
| | |
|---|---|
| *H01L 27/12* | (2006.01) |
| *H01L 29/786* | (2006.01) |
| *H01L 51/52* | (2006.01) |
| *G02F 1/1362* | (2006.01) |
| *G02F 1/1368* | (2006.01) |
| *G02F 1/1343* | (2006.01) |
| *H01L 27/32* | (2006.01) |

(52) U.S. Cl.
CPC .......... *H01L 27/124* (2013.01); *G02F 1/1368* (2013.01); *G02F 1/13439* (2013.01); *G02F 1/136227* (2013.01); *G02F 1/136286* (2013.01); *G02F 2001/13685* (2013.01); *G02F 2201/123* (2013.01); *G02F 2202/103* (2013.01); *G02F 2202/104* (2013.01); *H01L 27/1222* (2013.01); *H01L 27/3248* (2013.01); *H01L 27/3276* (2013.01); *H01L 29/78666* (2013.01); *H01L 29/78675* (2013.01); *H01L 51/5209* (2013.01)

(58) Field of Classification Search
CPC ............... H01L 27/124; H01L 27/1222; H01L 27/3248; H01L 27/3276; H01L 51/5209; H01L 29/78675; G02F 2001/13685; G02F 2001/123; G02F 2202/103; G02F 2202/104; G02F 1/136227; G02F 1/1368; G02F 1/13439; G02F 1/136286
See application file for complete search history.

(56) References Cited

U.S. PATENT DOCUMENTS

2008/0203391 A1* 8/2008 Kim ...................... G02F 1/1345
257/59

* cited by examiner

*Primary Examiner* — Yosef Gebreyesus
(74) *Attorney, Agent, or Firm* — McClure, Qualey & Rodack, LLP

(57) ABSTRACT

A display apparatus includes a substrate, a gate line disposed on the substrate and extending along a first direction, a gate insulating layer covering the gate line, a first data line disposed on the gate insulating layer and extending along a second direction different from the first direction, a first insulating layer covering the first data line, and a second data line disposed between the substrate and the gate insulating layer, or disposed on the first insulating layer, wherein the second data line extends along the second direction, and both of the first data line and the second data line intersect with the gate line.

8 Claims, 15 Drawing Sheets

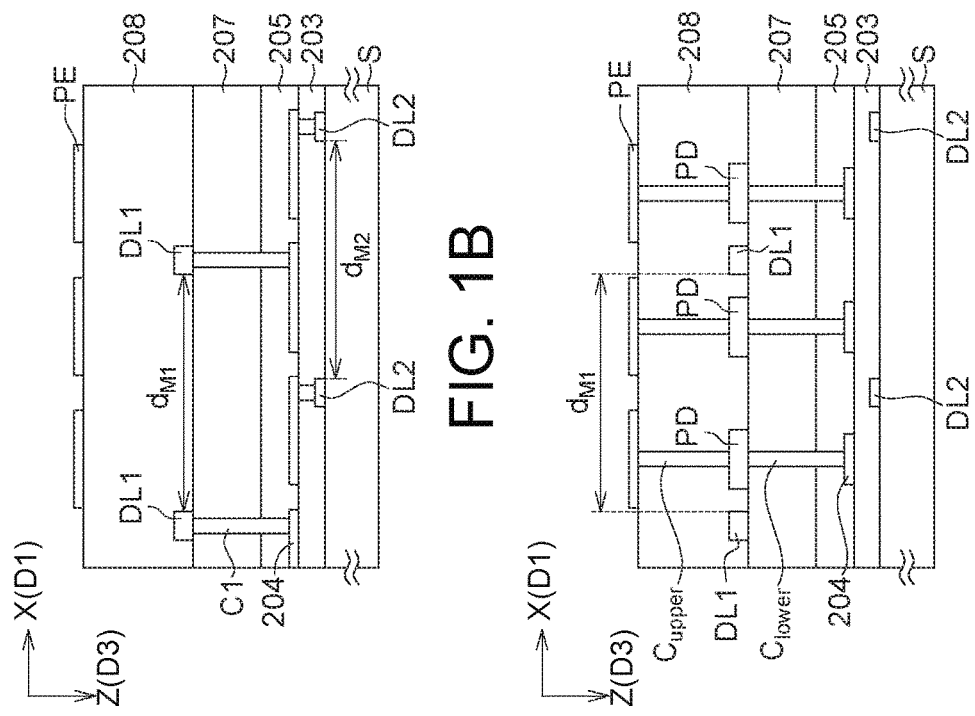
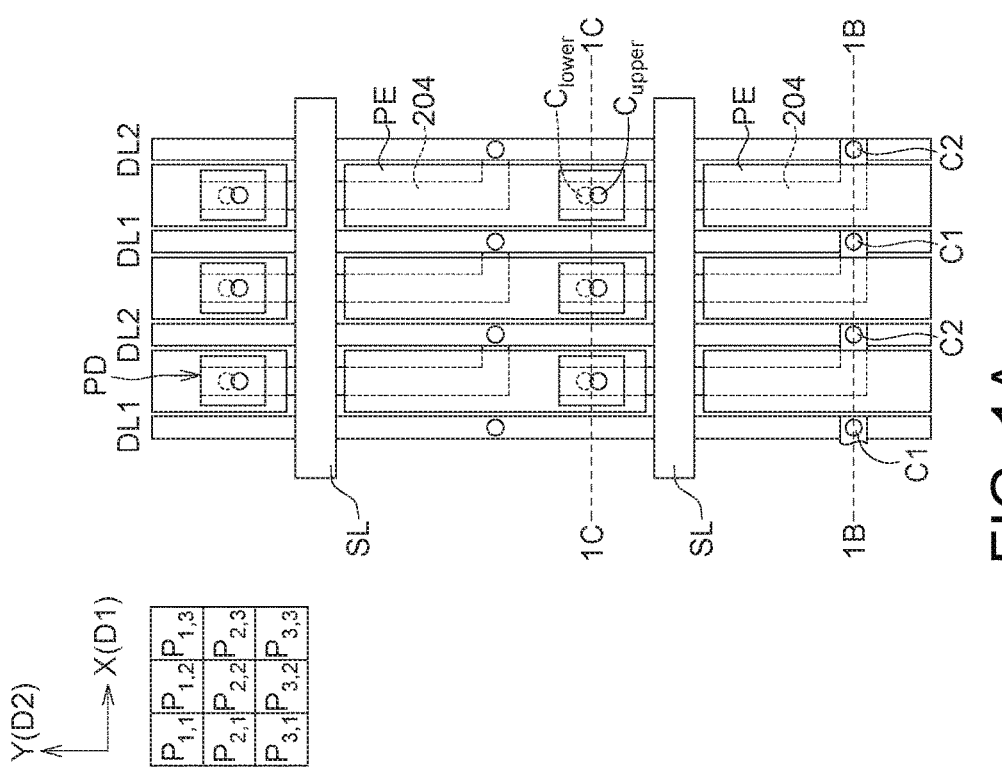
FIG. 1B
FIG. 1C
FIG. 1A

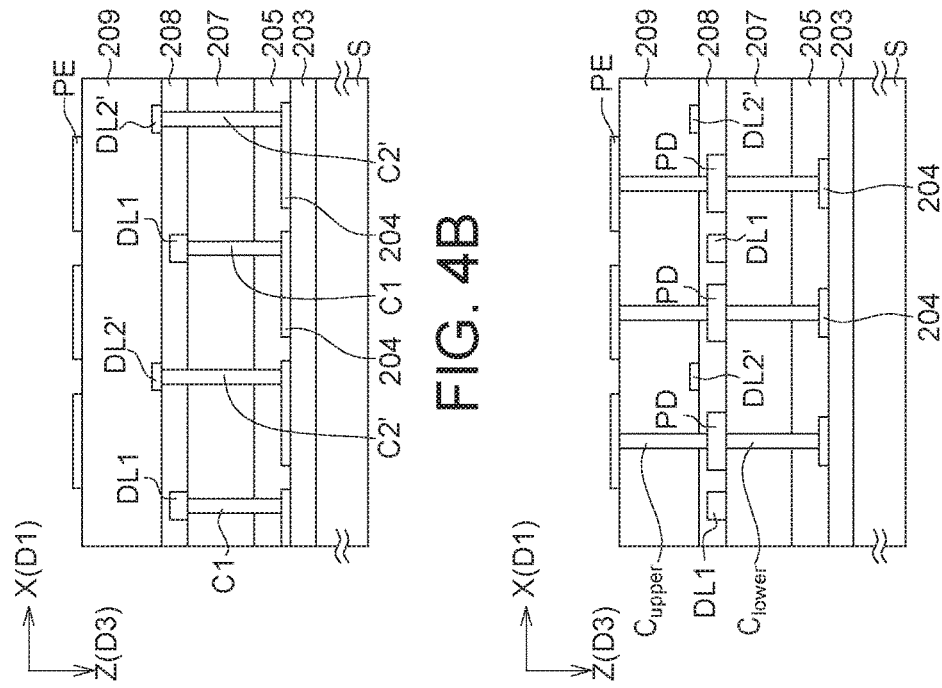
FIG. 4B
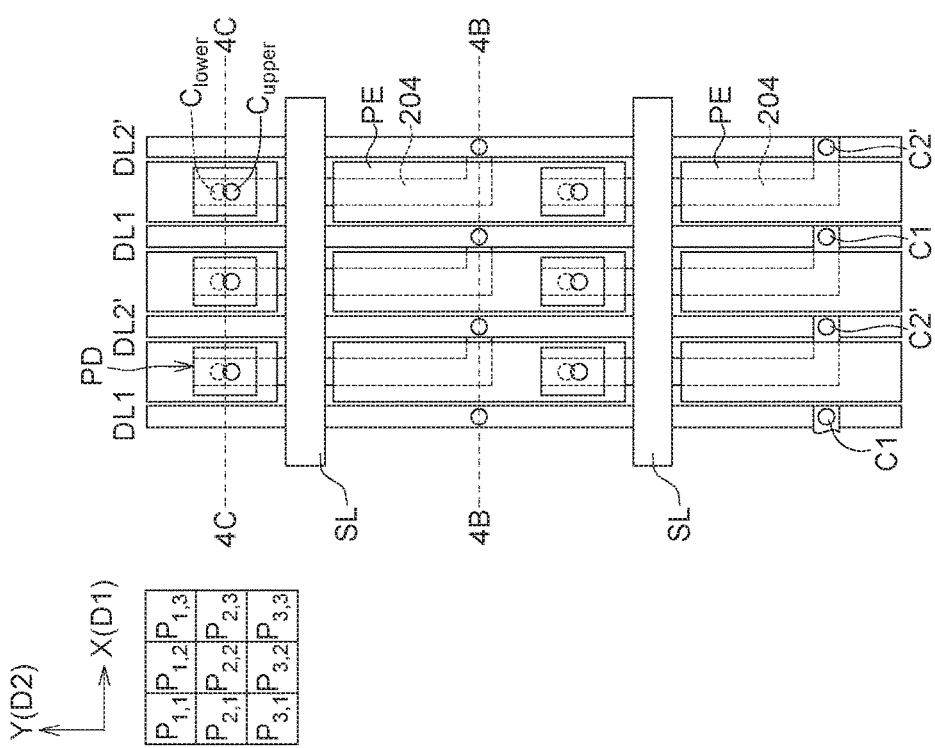
FIG. 4C
FIG. 4A

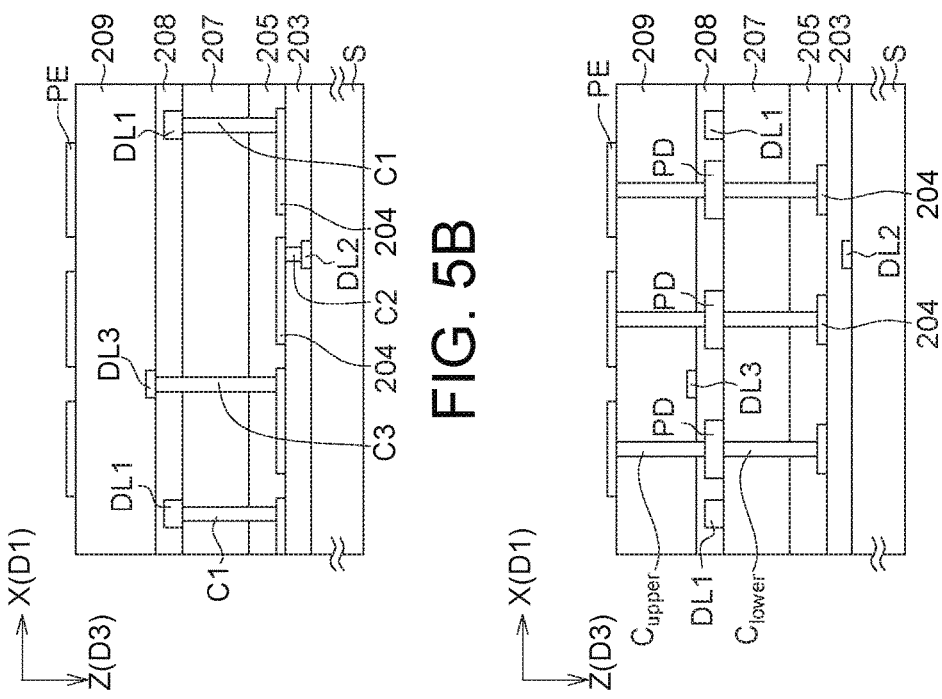
FIG. 5B
FIG. 5C
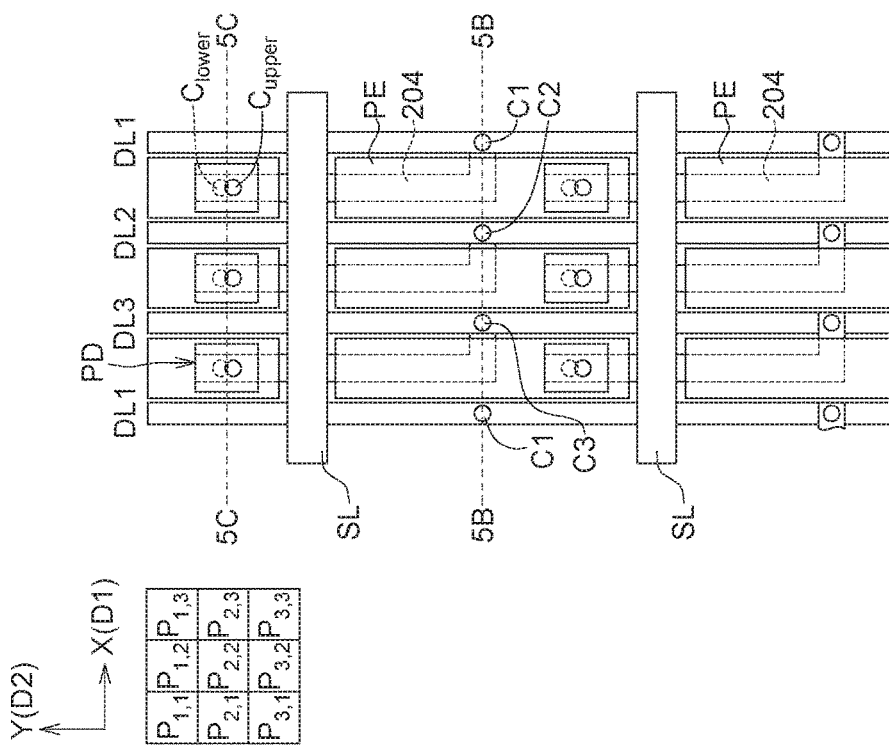
FIG. 5A

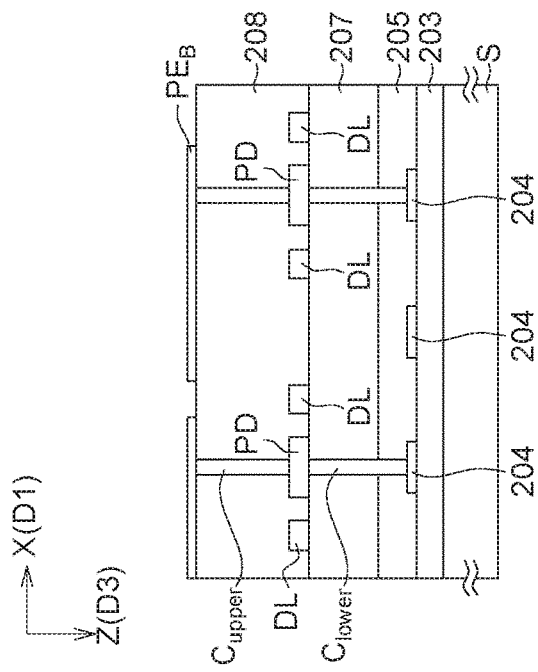
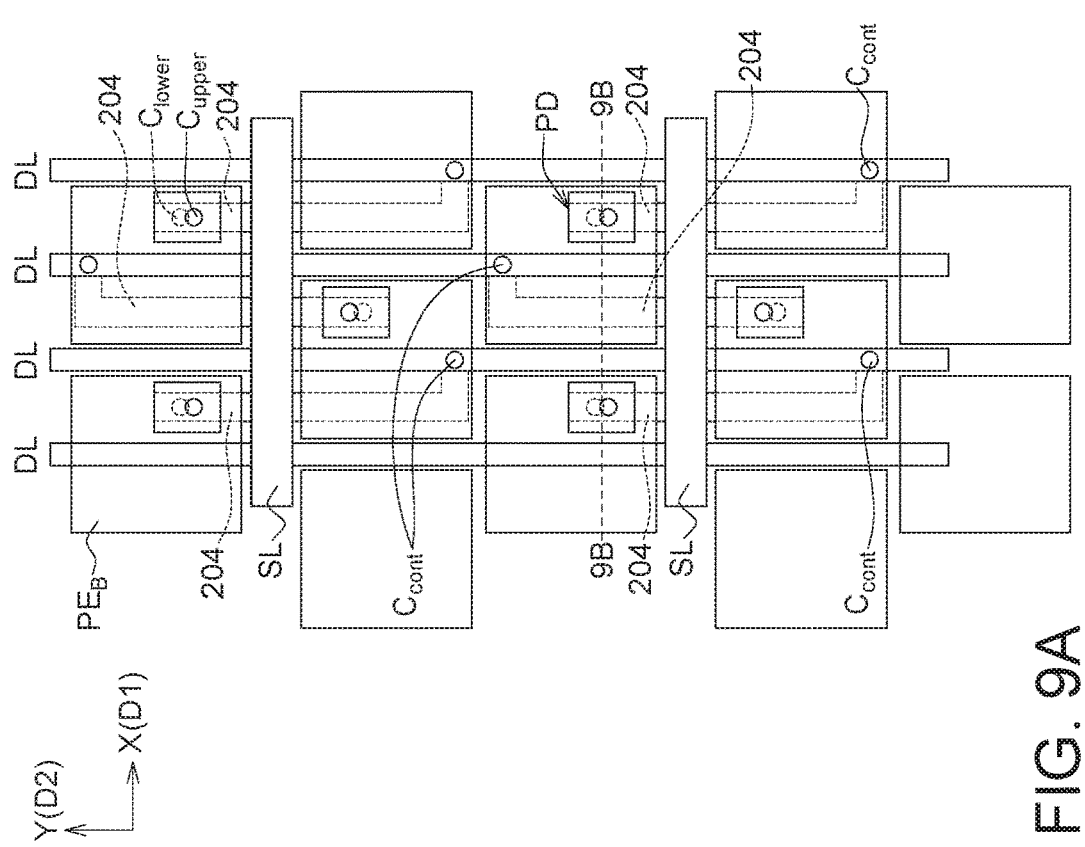
FIG. 9B
FIG. 9A

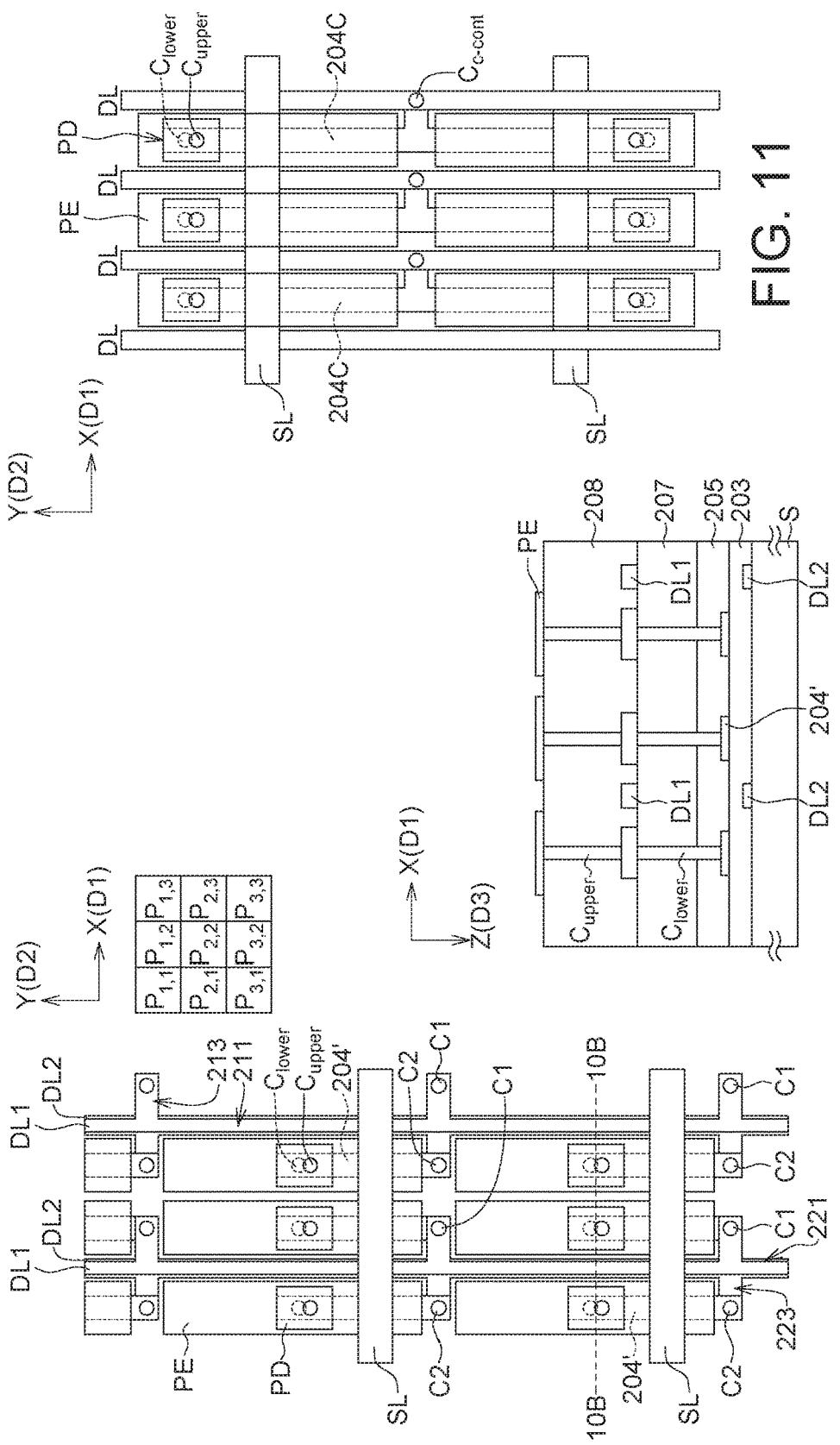

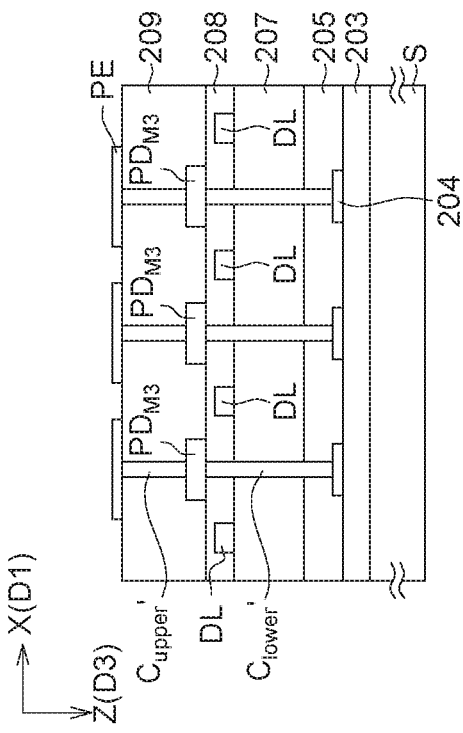
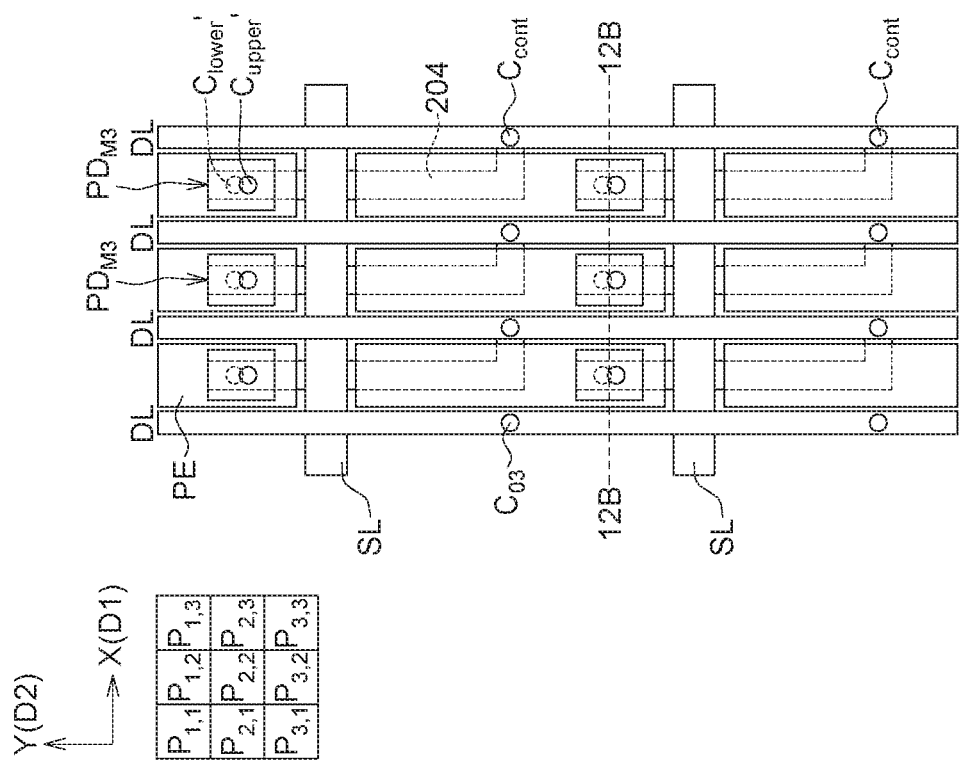
FIG. 12B
FIG. 12A

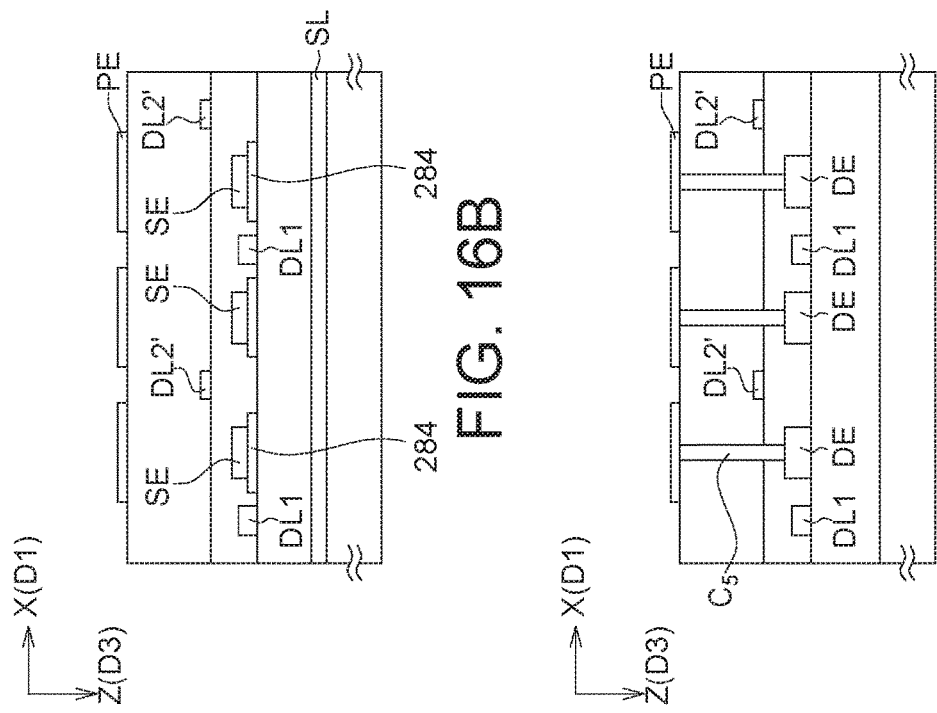
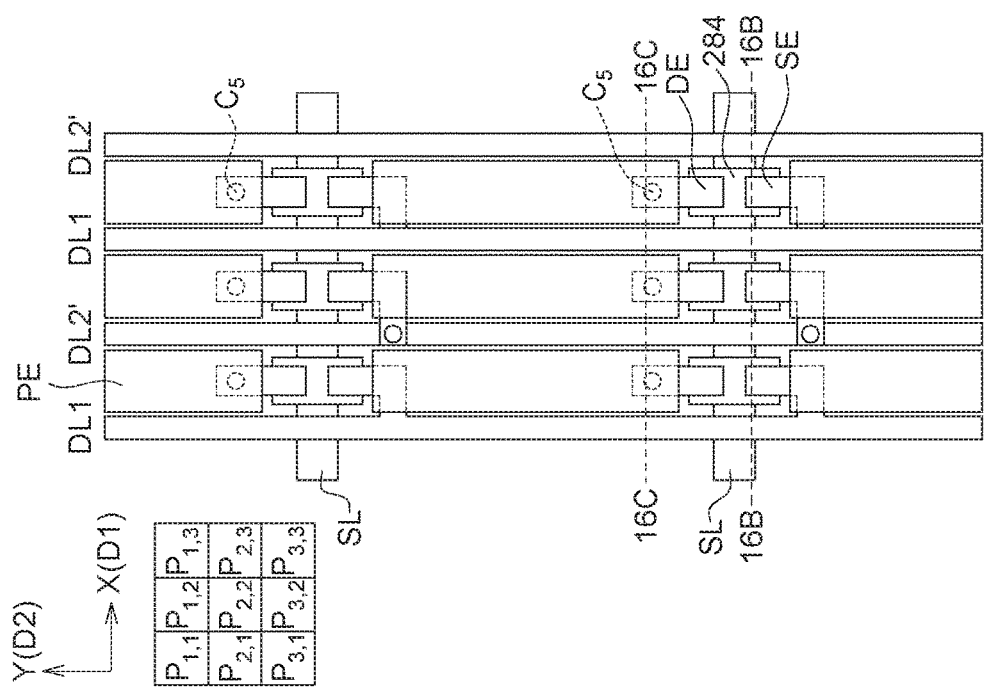

DISPLAY APPARATUS

BACKGROUND

Technical Field

The disclosure relates in general to a display apparatus, and more particularly to a pixel design of a display apparatus.

Description of the Related Art

Electronic products with display panel, such as smart phones, tablets, notebooks, monitors, and TVs, have become indispensable necessities to modern people no matter in their work, study or entertainment. With a flourishing development of the portable electronic products, the consumers pursue better electronic characteristics such as higher speed of response, longer life span and higher reliability, and functions of the products to be more diversified. Most important of all, the consumers have higher expects on the display quality even the display panel is not large. That means that more pixels per inch (i.e. high PPI) are required to meet requirement of a high-resolution the display panel in the application. However, in the conventional pixel design, there are some issues for a display panel having pixels with small pixel pitch.

A conventional display apparatus comprises a substrate, plural semiconductor portions disposed on the substrate, plural gate lines disposed above the substrate and insulated from the semiconductor portions, a first insulating layer covering the gate lines, plural data lines disposed on the first insulating layer, wherein in a normal direction view of the substrate, the data lines intersect with the gate lines to define the pixel regions. The conventional display apparatus further comprises plural conductive pads disposed on the first insulating layer and disposed corresponding to the pixel regions, respectively. The conductive pads are electrically connected to the corresponding semiconductor portions by the contacts, and electrically connected to the corresponding pixel electrodes of the pixel regions by another contacts.

In the conventional design, the data lines and the conductive pads could be formed from a second metal layer. When pixels with small pixel pitch are required in a display apparatus of the application, the widths (along X-direction) of the data lines and the conductive pads have to be decreased correspondingly. However, there is a process limitation to pattern the second metal layer for forming the data lines and the conductive pads. Also, in the application having pixels with small pixel pitch, the width of the pixel electrode (e.g. ITO) has to be reduced, and the smallest space between adjacent semiconductor portions is quite narrow.

SUMMARY

The disclosure is directed to a display apparatus having particular pixel design, wherein the embodied pixel designs are suitable for being applied to a display apparatus having pixels with small pixel pitch.

According to one embodiment of the present disclosure, a display apparatus is provided, comprising a substrate; a gate line disposed on the substrate and extending along a first direction; a gate insulating layer covering the gate line; a first data line disposed on the gate insulating layer and extending along a second direction, wherein the second direction is different from the first direction; a first insulating layer covering the first data line; and a second data line disposed between the substrate and the gate insulating layer, or disposed on the first insulating layer, wherein the second data line extends along the second direction, and both of the first data line and the second data line intersect with the gate line.

According to another embodiment of the present disclosure, a display apparatus is provided, comprising a substrate; a plurality of gate lines, disposed on the substrate and spaced apart from each other, the plurality of gate lines extending along a first direction; a gate insulating layer, covering the plurality of gate lines; a plurality of data lines disposed on the gate insulating layer and spaced apart from each other, the plurality of data lines extending along a second direction, the second direction different from the first direction, wherein the plurality of data lines intersect with the plurality of gate lines to define pixel regions; a plurality of conductive pads disposed on the gate insulating layer and respectively corresponding to the pixel regions; and a plurality of pixel electrodes electrically connected to the plurality of conductive pads correspondingly, wherein, from a top view of the substrate, two of the plurality of conductive pads in adjacent two of the pixel regions are disposed along the first direction and two of the plurality of conductive pads have different distances from one of the plurality of gate lines.

According to still another embodiment of the present disclosure, a display apparatus is provided, comprising a substrate; a plurality of gate lines, disposed above the substrate and spaced apart from each other, the plurality of gate lines extending along a first direction; a gate insulating layer, covering the plurality of gate lines; a plurality of data lines, disposed on the gate insulating layer and spaced apart from each other, the plurality of data lines extending along a second direction, the second direction different from the first direction, wherein the plurality of data lines intersect with the plurality of gate lines to define pixel regions; a first insulating layer, covering the plurality of data lines; a plurality of conductive pads, disposed correspondingly to the pixel regions, and at least one of the plurality of conductive pads disposed between the substrate and the gate insulating layer, or disposed on the first insulating layer; and a plurality of pixel electrodes disposed corresponding to one of the pixel regions, and electrically connected to the at least one of the plurality of conductive pads correspondingly.

The disclosure will become apparent from the following detailed description of the preferred but non-limiting embodiments. The following description is made with reference to the accompanying drawings.

BRIEF DESCRIPTION OF THE DRAWINGS

FIG. 1A is a top view of a pixel design of a display apparatus according to the embodiment 1-1 of the disclosure; FIG. 1B is a cross-sectional view of the display apparatus along the section line 1B-1B in FIG. 1A; FIG. 1C is a cross-sectional view of the display apparatus along the section line 1C-1C in FIG. 1A.

FIG. 4A is a top view of a pixel design of a display apparatus according to the first embodiment 1-2 of the disclosure; FIG. 4B is a cross-sectional view of the display apparatus along the section line 4B-4B in FIG. 4A; FIG. 4C is a cross-sectional view of the display apparatus along the section line 4C-4C in FIG. 4A.

FIG. 5A is a top view of a pixel design of a display apparatus according to the first embodiment 1-3 of the disclosure; FIG. 5B is a cross-sectional view of the display apparatus along the section line 5B-5B in FIG. 5A; FIG. 5C is a cross-sectional view of the display apparatus along the section line 5C-5C in FIG. 5A.

FIG. 9A is a top view of a pixel design of a display apparatus according to the third embodiment 3-2 of the disclosure; FIG. 9B is a cross-sectional view of the display apparatus along the section line 9B-9B in FIG. 9A.

FIG. 10A is a top view of a pixel design of a display apparatus according to the fourth embodiment of the disclosure; FIG. 10B is a cross-sectional view of the display apparatus along the section line 10B-10B in FIG. 10A.

FIG. 11 is a top view a pixel design of a display apparatus according to the fifth embodiment of the disclosure.

FIG. 12A is a top view of a pixel design of a display apparatus according to the six embodiment of the disclosure; FIG. 12B is a cross-sectional view of the display apparatus along the section line 12B-12B in FIG. 12A.

FIG. 16A is a top view of a pixel design of an embodied display apparatus of the disclosure according to the fourth application, wherein the embodied display apparatus has a-Si TFT structures; FIG. 16B is a cross-sectional view of the display apparatus along the section line 16B-16B in FIG. 16A; FIG. 16C is a cross-sectional view of the display apparatus along the section line 16C-16C in FIG. 16A.

DETAILED DESCRIPTION

Figure 2B:
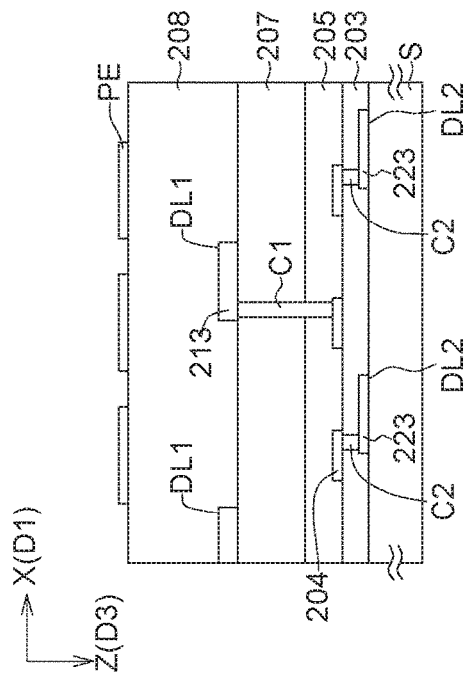
FIG. 2B is a cross-sectional view of the display apparatus along the section line 2B-2B in FIG. 2A.

In the present disclosure, a display apparatus having particular pixel design is provided, and the embodiments are suitable for being applied to a display apparatus having pixels with small pixel pitch. The embodiments of the disclosure can be applied to a liquid crystal (LC) display apparatus, but the disclosure is not limited thereto, also the disclosure can be applied to an organic light emitting display apparatus, or inorganic light emitting display apparatus, for example, micro-LED display apparatus or mini-LED display apparatus. Also, the embodiments of the disclosure can also be applied to different types of switching units (e.g. thin film transistor (TFT)) of pixels, such as the TFT in a low temperature polysilicon (LTPS) display apparatus (i.e. active layer comprising polysilicon), the amorphous polysilicon (a-Si) TFT in a LCD, the oxide TFT (e.g. IGZO) in an LCD, or other applicable types of TFT in a display apparatus. Thus, the materials of the semiconductor layer of TFTs are not limited; for example, amorphous silicon, polysilicon and metal oxides are all applicable.

The embodiments are described in details with reference to the accompanying drawings. However, the details of the structures and procedures of the embodiments are provided for exemplification, and the described details of the embodiments are not intended to limit the present disclosure. It is noted that not all embodiments of the invention are shown. Combinations of the exemplified embodiments are also applicable. Modifications and variations can be made without departing from the spirit of the disclosure to meet the requirements of the practical applications. Thus, there may be other embodiments of the present disclosure or applications which are not specifically illustrated. Further, the accompany drawings are simplified for clear illustrations of the embodiment; sizes and proportions in the drawings are not directly proportional to actual products, and shall not be construed as limitations to the present disclosure. Thus, the specification and the drawings are to be regard as an illustrative sense rather than a restrictive sense. Also, the identical and/or similar elements of the embodiments are designated with the same and/or similar reference numerals, for clearly illustrating the embodiments.

Moreover, use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements. Also, when a first material layer being formed at, on or above a second material layer have been described in the embodiments, it includes the condition of the first material layer contacting the second material layer. It also includes conditions of one or more material layers disposed between the first material layer and the second material layer, wherein the first material layer would be not directly contact the second material layer. Additionally, the terms for describing connection, such as "connect", "connect to each other", etc., can be referred to two structures in direct contact or in non-direct contact (i.e. other structure disposed therebetween), unless specially defined. Also, the terms of "adjacent" or "adjacently" can be referred to two elements positioned adjacently at the same horizontal level or at the different horizontal levels (e.g. the two elements are disposed respectively in the higher and lower positions).

First Embodiment

Embodiment 1-1

FIG. 1A is a top view of a pixel design of a display apparatus according to the embodiment 1-1 of the disclosure. FIG. 1B is a cross-sectional view of the display apparatus along the section line 1B-1B in FIG. 1A. FIG. 1C is a cross-sectional view of the display apparatus along the section line 1C-1C in FIG. 1A. Please refer to FIG. 1A-FIG. 1C. In an exemplary embodiment, a display apparatus comprises a substrate S, plural semiconductor portions 204 (such as polysilicon portions) disposed on the substrate S, plural gate lines SL disposed on the substrate S (e.g. disposed above and insulated from the semiconductor portions 204 by a gate insulating layer 205) and extending along a first direction D1 (e.g. X-direction), a first insulating layer 207 covering the gate lines SL, plural first data lines (data busline) DL1 disposed on the first insulating layer 207 and extending along a second direction D2 (e.g. Y-direction), a second insulating layer 208 covering the first data lines DL1, and plural second data lines (data busline) DL2 extending along the second direction D2. According to the first embodiment, the second data lines DL2 are disposed between the substrate S and the gate insulating layer 205; for example, the second data lines DL2 are disposed under the semiconductor portions 204 and insulated from the semiconductor portions 204 by a third insulating layer 203, as shown in FIG. 1B and FIG. 1C.

In some of the embodiments, the gate lines SL disposed on the substrate S can be configured as non-straight lines and extend along the first direction D1 (e.g. X-direction). Also, in some embodiments, the gate lines SL may have different widths along the second directions D2 (e.g. Y-direction). In some of the embodiments, the first data lines DL1 and the second data lines DL2 can be configured as non-straight lines (for example, configured as zigzag-shaped lines), and extend along the second direction D2 (e.g. Y-direction).

The first data lines DL1 and the second data lines DL2 intersect with the gate lines SL to define pixel regions. Nine pixel regions (e.g., $P_{1,1}$, $P_{1,2}$, $P_{1,3}$, $P_{2,1}$, $P_{2,2}$, $P_{2,3}$, $P_{3,1}$, $P_{3,2}$, $P_{3,3}$ denoted correspondingly in the corner of FIG. 1A) arranged as a matrix are exemplified herein. Also, adjacent two of the semiconductor portions 204 are electrically connected to the first data line DL1 and the second data line DL2 through a first contact C1 and a second contact C2, respectively. Although the exemplary drawings depict the pixel regions having regular shape, the disclosure is not limited thereto. In some of the embodiments, the pixel regions can be configured in irregular shapes, depending on the pixel design of the application, but they are shown as periodically arranged units.

The display apparatus further comprises plural conductive pads PD disposed on the first insulating layer 207 and disposed corresponding to the pixel regions, respectively. According to the first embodiment, the conductive pads PD and the first data lines DL1 can be formed from the same metal layer such as the second metal layer (i.e. at the same horizontal level), and at least one of the conductive pads PD is disposed between the first data line DL1 and the second data line DL2 positioned adjacently. The conductive pads PD would function as drain pads of the TFT structures. Moreover, one of the conductive pads PD is electrically connected to the corresponding semiconductor portion 204 through a lower contact $C_{lower}$, and electrically connected to a corresponding pixel electrode PE above through an upper contact $C_{upper}$.

It is noted that the disclosure is not limited to the applications of LCD apparatus. The disclosure can be applied to other types of display apparatus, such as LED, OLED and QLED apparatus, wherein the pixel electrode PE as described in this example can be one of the electrodes of the diodes of the LED, OLED or QLED apparatus. Additionally, the pixel electrodes are electrically connected to the corresponding conductive pads (e.g. drain pads), but the pixel electrodes, in some applications, may not be disposed right above the corresponding pixel regions. For example, the anodes of OLED apparatus would not be disposed right above the corresponding pixel regions, and the pixel thereof is driven by the gate line SL, data line DL correspondingly.

In the pixel design of the first embodiment, another conductive layer (such as a metal layer for making a light-shielding layer) which is different from a conductive layer (such as a second metal layer) for making the first data lines DL1 is applied to form another conductive pattern comprising the second data lines DL2. As shown in FIG. 1A and FIG. 1B, the first data lines DL1 and the second data lines DL2 fabricated from different conductive layers (or metal layers) are arranged alternately. Therefore, compared to the conventional pixel design, the first data lines DL1 can be arranged more loosely; for example, a distance between two adjacent first data lines DL1 along the first direction D1 (e.g. X-direction) is increased. Also, a distance $d_{M2}$ between two adjacent second data lines DL2 along the first direction D1 (e.g. X-direction) can be enlarged.

Figure 2A:
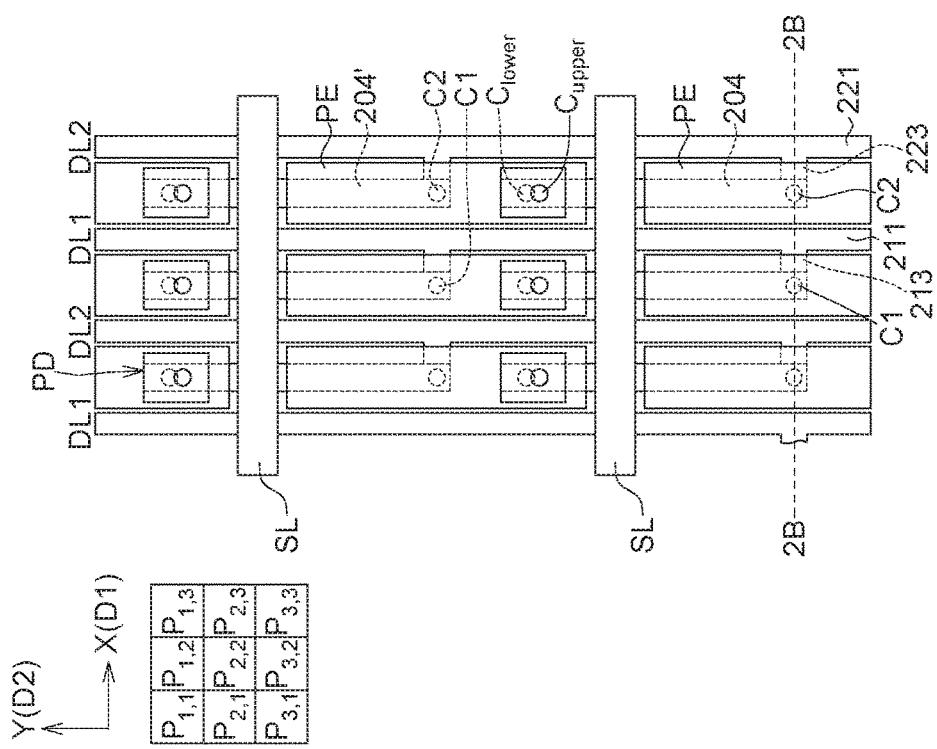
FIG. 2A is a top view of a pixel design of a display apparatus according to a modification of the first embodiment 1-1 of the disclosure.

Besides the embodiment presented by the configurations of FIG. 1A-FIG. 1C as described above, the positions of the first contacts C1 and the second contacts C2 for respectively connecting adjacent two semiconductor portions 204 to the first data line DL1 and the second data line DL2 can be changed, and the shapes of the data lines and semiconductor portions would be modified correspondingly. FIG. 2A is a top view of a pixel design of a display apparatus according to a modification of the first embodiment 1-1 of the disclosure. FIG. 2B is a cross-sectional view of the display apparatus along the section line 2B-2B in FIG. 2A. Please refer to FIG. 2A and FIG. 2B. The identical and/or similar elements of the embodiments in FIG. 2A/2B and FIG. 1A/1B/1C are designated with the same and/or similar reference numerals, and the element details have been described above and are not redundantly repeated.

In the exemplified configurations of FIG. 1A-FIG. 1C, the first contacts C1 are disposed overlapping with the first data lines DL1 extending along the second direction D2, and each of the first contacts C1 is at least partially (partially or fully) covered by the corresponding first data line DL1. Similarly, the second contacts C2 are disposed overlapping with the second data lines D2 extending along the second direction, and each of the second contacts C2 is partially or fully covered by the corresponding second data line DL2. Also, L-shaped semiconductor portions 204 are adopted due to the positions of the first contacts C1 and the second contacts C2 in the exemplified configurations of FIG. 1A-FIG. 1C.

In another exemplified configurations as shown in FIG. 2A-FIG. 2B, the first contacts C1 and the second contacts C2 are positioned within the pixel regions. Accordingly, the shapes of the data lines (i.e. DL1 and DL2) are modified in corresponding to the positions of the first contacts C1 and the second contacts C2. For example, each of the first data lines DL1 comprises a first body portion 211 extending along the second direction D2, and several first protruding portions 213 extending along the first direction D1 and connected to the first body portion 211, and each of the first protruding portions 213 is positioned within the corresponding pixel region, wherein the first contacts C1 are electrically connected to the first protruding portions 213 within the pixel regions. Similarly, each of the second data lines DL2 comprises a second body portion 221 extending along the second direction D2, and several second protruding portions 223 extending along the first direction D1 and connected to the second body portion 221, and each of the second protruding portions 223 is positioned within the corresponding pixel region, wherein the second contacts C2 are electrically connected to the second protruding portions 223 within the pixel regions. Also, semiconductor portions 204' can be adopted in the exemplified configurations of FIG. 2A-FIG. 2B. Space between adjacent semiconductor portions 204' of FIG. 2A-FIG. 2B is improved. In another embodiment, the first protruding portions 213 and the second protruding portions 223 could extend along a third direction (not shown), the third direction is different from the second direction, as long as the first protruding portions 213 connected to the first body portions 211, and the second protruding portions 223 connected to the second body portions 221. Furthermore, the first protruding portions 213 and the second protruding portions 223 could extend to different directions, this disclosure is not limited thereto. Also, the third direction can be the same as the first direction or different from the first direction, and the disclosure has not particular limitation thereto.

Figure 3A:
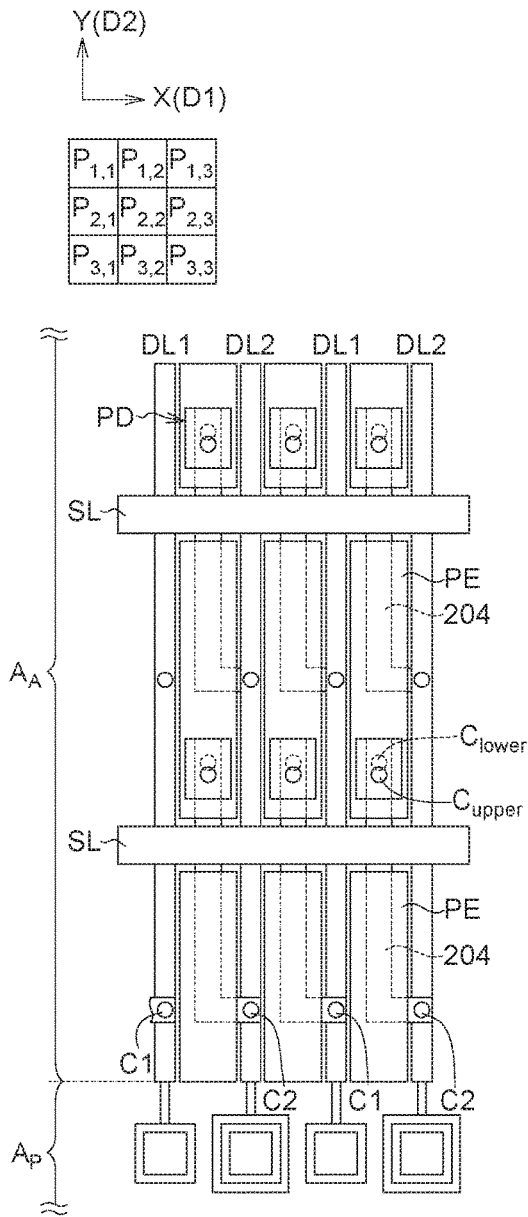
FIG. 3A-FIG. 3C demonstrate different configurations of the pixel design of the first embodiment 1-1 in an active area $A_A$ and data driving IC connections in a peripheral area $A_P$.
Figure 3B:
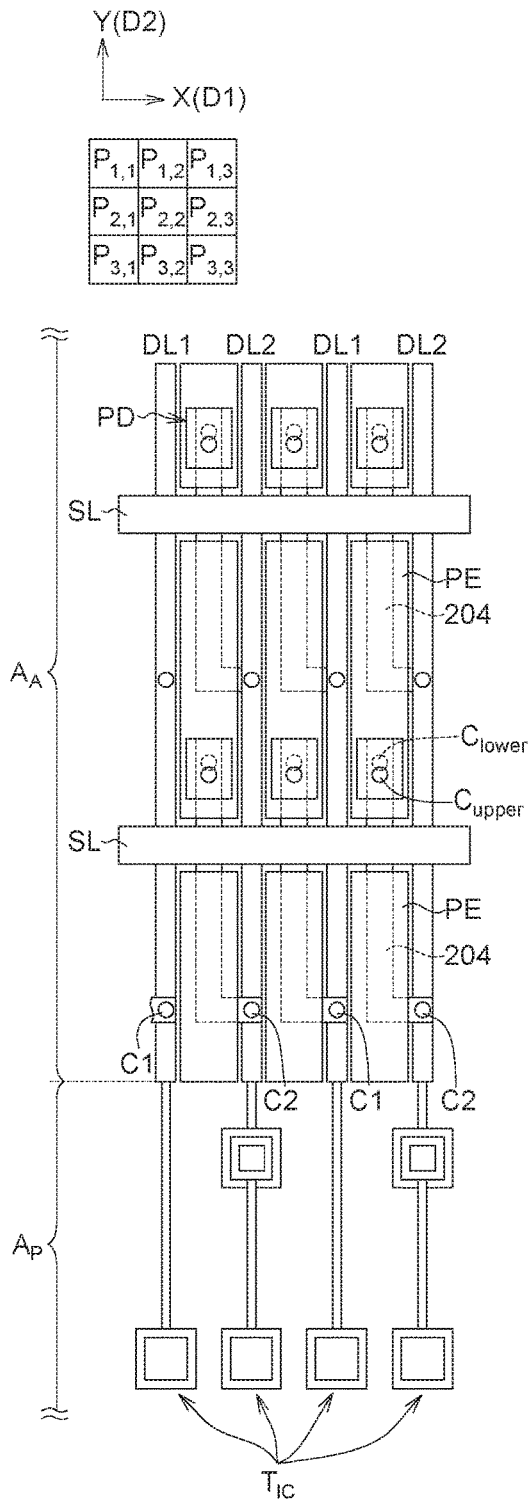
Figure 3C:
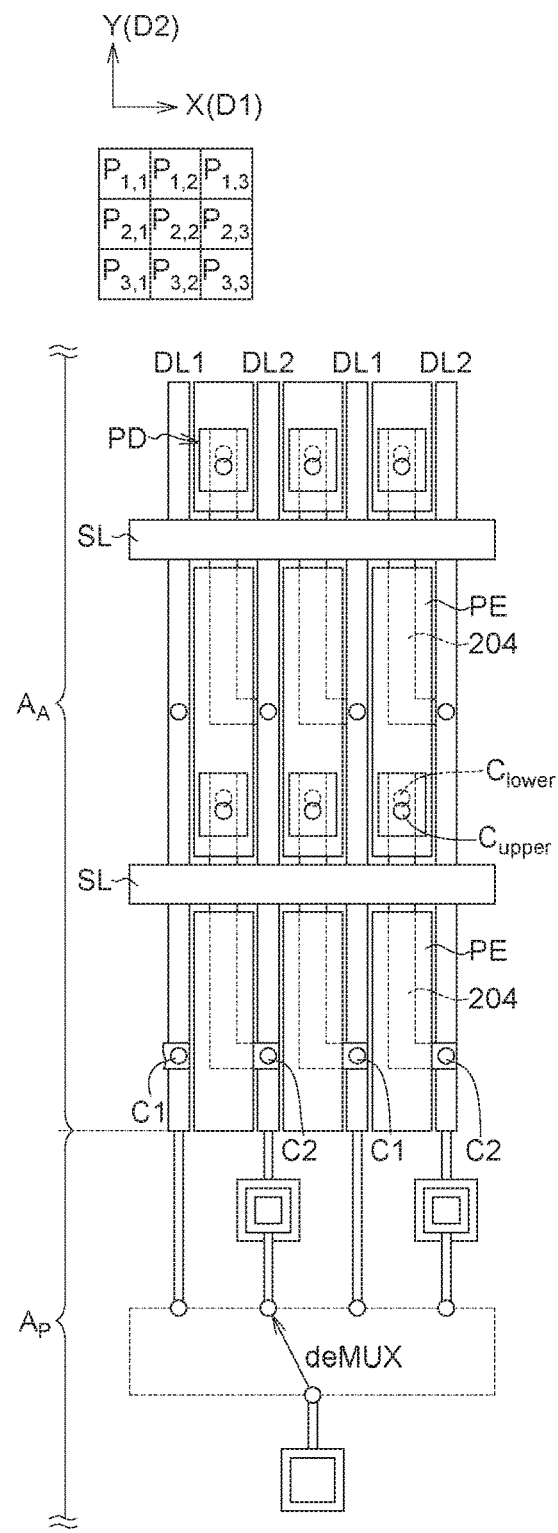

FIG. 3A-FIG. 3C demonstrate different configurations of the pixel design of the first embodiment 1-1 in an active area $A_A$ and data driving IC connections in a peripheral area $A_P$. The first data lines DL1 and the second data lines DL2 can be connected to the IC terminals $T_{IC}$ of an IC (IC is not shown in FIG. 3A-FIG. 3C) by the known ways shown in FIG. 3A-FIG. 3 C. In FIG. 3C, the first data lines DL1 and the second data lines DL2 can be connected to a demultiplexer deMUX (i.e. a single-input, multiple-output switch). The disclosure has no limitation to the connection between the first data lines DL1/the second data lines DL2 and the IC terminals.

Embodiment 1-2

FIG. 4A is a top view of a pixel design of a display apparatus according to the first embodiment 1-2 of the disclosure. FIG. 4B is a cross-sectional view of the display apparatus along the section line 4B-4B in FIG. 4A. FIG. 4C is a cross-sectional view of the display apparatus along the section line 4C-4C in FIG. 4A. Please refer to FIG. 4A-FIG. 4C. The identical and/or similar elements of the embodiments in FIG. 4A-FIG. 4C and FIG. 1A-FIG. 1C are designated with the same and/or similar reference numerals, and the element details have been described above and are not redundantly repeated.

According to the embodiment 1-1 (e.g. FIG. 1A-FIG. 1C and FIG. 2A-FIG. 2B), the pixel design arranges the data lines at two different horizontal levels, such as the first data lines DL1 disposed on the first insulating layer 207 and the second data lines DL2 disposed between the substrate S and the gate insulating layer 205; in other words, the second data lines DL2 are positioned at a horizontal level lower than the horizontal level of the first data lines DL1. However, the disclosure is not limited to the configurations of the embodiment 1-1. According to the embodiment 1-2, as shown in FIG. 4B and FIG. 4C, the second data lines DL2' are positioned at a horizontal level higher than the horizontal level of the first data lines DL1. In one embodiment, the first data lines DL1 and the second data lines DL2' can be fabricated from a second metal layer and a third metal layer, respectively. The second insulating layer 208 covers the first data lines DL1, and the second data lines DL2' are disposed on the second insulating layer 208. The second data lines DL2' are covered by a fourth insulating layer 209, and the pixel electrodes PE are disposed on the fourth insulating layer 209. Also, as shown in FIG. 4A and FIG. 4B, adjacent two of the semiconductor portions 204 are electrically connected to the first data line DL1 and the second data line DL2' through a first contact C1 and a second contact C2', respectively. The first contacts C1 are disposed overlapping with the first data lines DL1 extending along the second direction D2, and the second contacts C2' are disposed overlapping with the second data lines DL2' extending along the second direction.

Spatial arrangements and structural details of other elements in FIG. 4A-FIG. 4C, such as the gate lines SL, the third insulating layers 203, and the gate insulating layer 205, the semiconductor portions 204, the first insulating layer 207, the conductive pads PD, as well as the positions (including extending directions) and connections thereof, have been described above and are not redundantly repeated here.

Furthermore, the first contacts C1 and the second contacts C2' can also be positioned within the pixel regions, and the shapes of the data lines (e.g. DL1 and DL2') and the shapes of the semiconductor portions 204 should be modified in corresponding to the positions of the first contacts C1 and the second contacts C2'. The details, such as the data lines comprising protruding portions (213 and 223) extending along the first direction D1 and the rectangular semiconductor portions described above (i.e. the contents related to FIG. 2A and FIG. 2B), are not redundantly repeated again.

Embodiment 1-3

Configurations of the pixels by combining the design concepts of the embodiments 1-1 and 1-2 are also feasible. FIG. 5A is a top view of a pixel design of a display apparatus according to the first embodiment 1-3 of the disclosure. FIG. 5B is a cross-sectional view of the display apparatus along the section line 5B-5B in FIG. 5A. FIG. 5C is a cross-sectional view of the display apparatus along the section line 5C-5C in FIG. 5A. The identical and/or similar elements of the embodiments in FIG. 5A-FIG. 5C, FIG. 4A-FIG. 4C and FIG. 1A-FIG. 1C are designated with the same and/or similar reference numerals, and the element details have been described above and are not redundantly repeated.

The embodiment 1-3 provides one of the applicable combinations of the embodiments 1-1 and 1-2, wherein the pixel design arranges the data lines at three different horizontal levels (in an regular order or an irregular order), such as the first data lines DL1 disposed on the first insulating layer 207, the second data lines DL2 disposed between the substrate S and the gate insulating layer 205, and the third data lines DL3 disposed on the second insulating layer 208. Also, as shown in FIG. 5A and FIG. 5B, adjacent three of the semiconductor portions 204 are electrically connected to the first data line DL1, the second data line DL2 and the third data line DL3 through a first contact C1, a second contact C2 and a third contact C3, respectively. Please also refer to the second data line DL2 of the embodiment 1-1 (FIG. 1A-FIG. 1C) for the second data line DL2 of the embodiment 1-3, and the second data line DL2' of the embodiment 1-2 (FIG. 4A-FIG. 4C) for the third data line DL3 of the embodiment 1-3; the structural details and connections of the first data line DL1, the second data line DL2 and the third data line DL3 herein are not redundantly repeated. It is noted that arrangement of the first data line DL1, the second data line DL2 and the third data line DL3 can be in a regular order or an irregular order; the present disclosure has no particular limitations thereto. For example, FIG. 5A depicts a first data line DL1, a third data line DL3, a second data line DL2 and a first data line DL1 arranged along the first direction D1 (e.g. X-direction). As long as adjacent two of the semiconductor portions 204 are electrically connected to the data lines at different horizontal levels, a space between two adjacent data lines at the same horizontal level (e.g. adjacent first data lines DL1 disposed on the first insulating layer 207, or adjacent second data lines DL2 disposed between the substrate S and the third insulating layer 203, or adjacent third data lines DL3 disposed on the second insulating layer 208) would be increased and larger than that of the conventional pixel design.

Accordingly, the design of the first embodiment (e.g. the embodiments 1-1, 1-2 and 1-3) at least arranges the data lines at two different horizontal levels, and it would be easier to form the conductive patterns (such as the pattern of the first data lines, the pattern of the second data lines, the pattern of the conductive pads) and related elements/layers of the pixels. Thus, the pixel design of the embodiment is particularly suitable for the display apparatus having pixels with small pixel pitch in the practical application.

Second Embodiment

Figures 6A, 6B, 7:
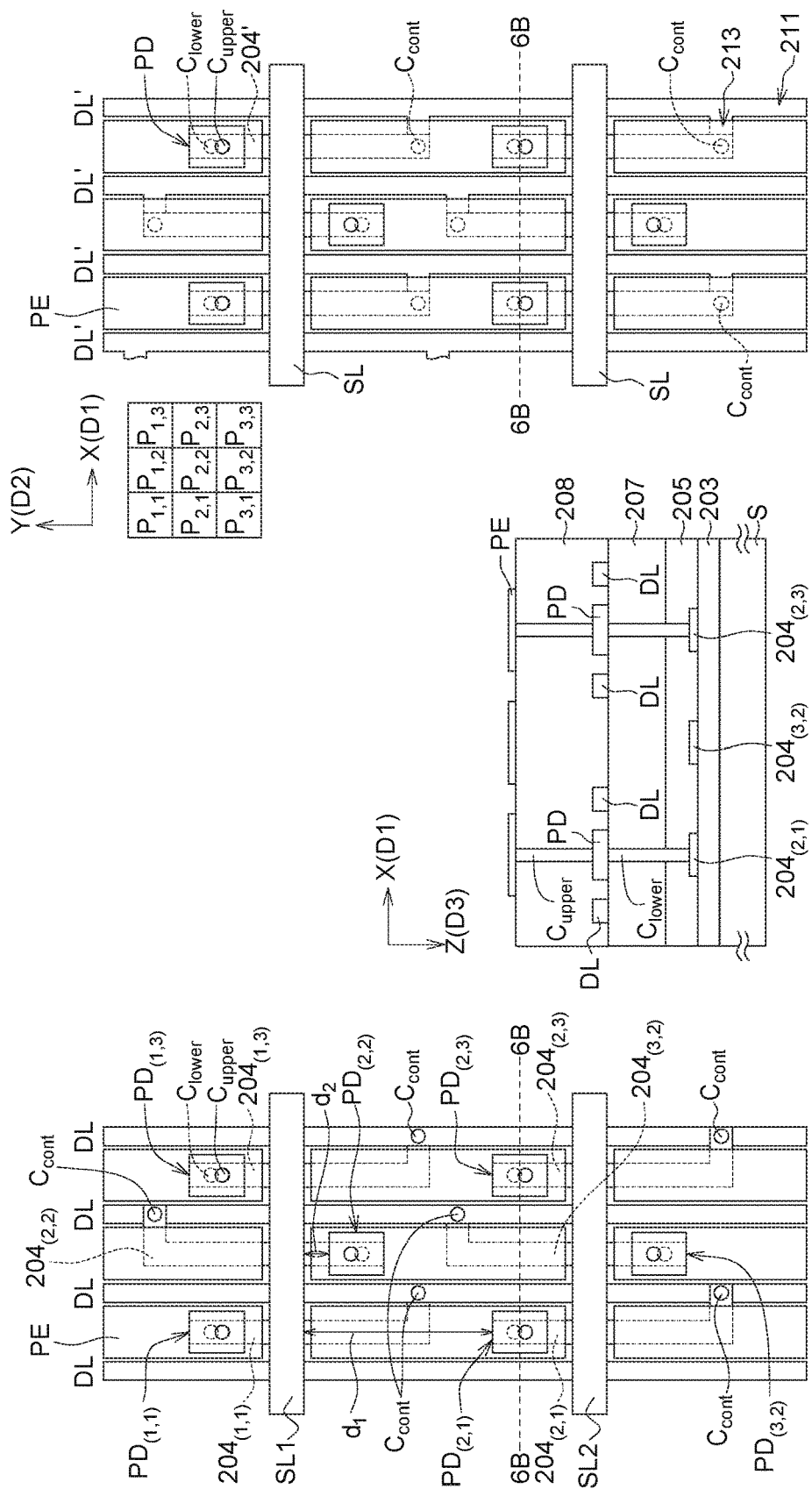
FIG. 6A is a top view of a pixel design of a display apparatus according to the second embodiment of the disclosure.
FIG. 6B is a cross-sectional view of the display apparatus along the section line 6B-6B in FIG. 6A.
FIG. 7 is a top view of another pixel design of a display apparatus according to the second embodiment of the disclosure.

FIG. 6A is a top view of a pixel design of a display apparatus according to the second embodiment of the disclosure. FIG. 6B is a cross-sectional view of the display apparatus along the section line 6B-6B in FIG. 6A. The identical and/or similar elements of the embodiments in FIG. 6A-FIG. 6B and FIG. 1A-FIG. 1C are designated with the same and/or similar reference numerals, and the details have been described above and are not redundantly repeated.

In the second embodiment, the contacts (e.g. $C_{cont}$ in FIG. 6A-FIG. 6B) for electrically connecting the data lines and the semiconductor portions (e.g. polysilicon as an active layer of TFT) are misaligned along the first direction D1 (e.g. X-direction), so that the data lines can be arranged more closely without affecting the electrical connections and positions of the contacts (e.g. $C_{cont}$ in FIG. 6A-FIG. 6B).

As shown in FIG. 6A and FIG. 6B, a display apparatus comprises a substrate S, plural semiconductor portions 204 (such as polysilicon portions) disposed on the substrate S, plural gate lines SL disposed on the substrate S (e.g. disposed above and insulated from the semiconductor portions 204 by a gate insulating layer 205) and extending along the first direction D1 (e.g. X-direction), a first insulating layer 207 covering the gate lines SL, plural data lines DL disposed on the first insulating layer 207 and extending along the second direction D2 (e.g. Y-direction), plural conductive pads PD disposed on the first insulating layer 207, and a second insulating layer 208 covering the data lines DL and the conductive pads PD. The data lines DL intersect with the gate lines SL to define pixel regions. The conductive pads PD are electrically connected to pixel electrodes PE correspondingly. The pixel electrode PE is driven by driving signals through corresponding gate line SL, data line DL and conductive pad PD.

Nine pixel regions (e.g., $P_{1,1}$, $P_{1,2}$, $P_{1,3}$, $P_{2,1}$, $P_{2,2}$, $P_{2,3}$, $P_{3,1}$, $P_{3,2}$, $P_{3,3}$ denoted correspondingly in the corner of FIG. 6A) arranged as a matrix are exemplified herein; therefore, the semiconductor portions of TFT and the conductive pads in the related pixel region can also be labelled by adding the specified positions corresponding to pixel positions, such as the semiconductor portions $204_{(1,1)}$, $204_{(1,3)}$, $204_{(2,2)}$, $204_{(2,1)}$, $204_{(2,3)}$, $204_{(3,2)}$ and the conductive pads $PD_{(1,1)}$, $PD_{(1,3)}$, $PD_{(2,2)}$, $PD_{(2,1)}$, $PD_{(2,3)}$, $PD_{(3,2)}$, for clear illustration, but not for limitation.

According to the second embodiment, the conductive pads PD and the data lines DL can be formed from the same metal layer such as the second metal layer (i.e. at the same horizontal level), and each of the conductive pads PD is disposed between the data lines DL positioned adjacently. The conductive pads PD would function as drain pads of the TFT structures. Similarly, one of the conductive pads PD is electrically connected to the corresponding semiconductor portion 204 through a lower contact $C_{lower}$, and electrically connected to a corresponding pixel electrode PE through an upper contact $C_{upper}$.

As shown in FIG. 6A, from a top view of the display apparatus of the second embodiment, two of the conductive pads PD in adjacent two of the pixel regions disposed along the first direction D1 (e.g. X-direction) are disposed nearby adjacent two of the gate lines SL1, SL2, respectively. Take the pixel regions $P_{2,1}$ and $P_{2,2}$ disposed along the first direction D1 as an example, the conductive pads $PD_{2,1}$ and $PD_{2,2}$ are respectively disposed nearby adjacent two gate lines SL1 and SL2 as shown in FIG. 6A. In other words, a distance $d_1$ between the conductive pad $PD_{2,1}$ and the gate line SL1 is greater than a distance $d_2$ between the conductive pad $PD_{2,2}$ and the gate line SL1, and a distance between the conductive pad $PD_{2,2}$ and the gate line SL2 is greater than a distance between the conductive pad $PD_{2,1}$ and the gate line SL2.

In another embodiment, from a top view of the display apparatus of the second embodiment, two of the conductive pads PD in adjacent two of the pixel regions disposed along the first direction D1 (e.g. X-direction) are misaligned to each other in the first direction. For example, the conductive pads $PD_{2,1}$ and $PD_{2,2}$ of the pixel regions $P_{2,1}$ and $P_{2,2}$ disposed along the first direction D1 are misaligned to each other in the first direction D1 (e.g. X-direction). As shown in FIG. 6A, the conductive pad $PD_{2,1}$ is disposed correspondingly to a lower portion of the pixel region $P_{2,1}$, and the conductive pad $PD_{2,2}$ is disposed correspondingly to an upper portion of the pixel region $P_{2,2}$. In another embodiment, a distance $d_1$ between the conductive pad $PD_{2,1}$ and the gate line SL1 is different from a distance $d_2$ between the conductive pad $PD_{2,2}$ and the gate line SL1, or a distance between the conductive pad $PD_{2,2}$ and the gate line SL2 is different from a distance between the conductive pad $PD_{2,1}$ and the gate line SL2.

In the pixel design of the second embodiment, the semiconductor portions 204 are electrically connected to the data lines DL correspondingly through the contacts $C_{cont}$, and adjacent two of the contacts $C_{cont}$ are misaligned to each other in the first direction D1 (e.g. X-direction), For example, the contact $C_{cont}$ for connecting the semiconductor portions $204_{(2,1)}$ of the pixel regions $P_{2,1}$ and the contact $C_{cont}$ for connecting the semiconductor portions $204_{(2,2)}$ of the pixel regions $P_{2,2}$ are misaligned to each other in the first direction D1. In other words, the contact $C_{cont}$ for connecting the semiconductor portions $204_{(2,1)}$ of the pixel regions $P_{2,1}$ and the contact $C_{cont}$ for connecting the semiconductor portions $204_{(2,2)}$ of the pixel regions $P_{2,2}$ have different distances from the gate line SL1 between the pixel regions $P_{1,1}$ and $P_{2,1}$.

Additionally, As shown in FIG. 6A, the semiconductor portions such as $204_{(2,1)}$ and $204_{(2,2)}$ having different shapes are arranged alternately along the first direction (e.g. X-direction) in the second embodiment. From a top view of the semiconductor portions of the second embodiment, two of the semiconductor portions corresponding to two of the pixel regions positioned adjacently along the first direction (e.g. X-direction) have the shapes upside down to each other in the second direction D2 (e.g. Y-direction). For example, the shapes of the semiconductor portions $204_{(2,1)}$ of the pixel regions $P_{2,1}$ and the semiconductor portions $204_{(2,2)}$ of the pixel regions $P_{2,2}$ are upside down to each other in the second direction D2 (e.g. Y-direction). As shown in FIG. 6A, it is assumed that the contact $C_{cont}$ to the lower contact $C_{lower}$ of the pixel regions $P_{2,1}$ is a "bottom-to-top" disposition of a semiconductor portion, and the contact $C_{cont}$ to the lower contact $C_{lower}$ of the pixel regions $P_{2,2}$ is a "top-to-bottom" disposition of another semiconductor portion. That is, if the second direction D2 (e.g. Y-direction) is defined as a vertical direction, the shape of the semiconductor portions $204_{(2,2)}$ of TFT is an upside-down shape in the vertical direction of the semiconductor portions $204_{(2,1)}$. Accordingly, compared to the conventional pixel design, the semiconductor portions (e.g. polysilicon) can be arranged more loosely, so that the gap(/distance) between two adjacent semiconductor portions can be enlarged.

Also, the contacts $C_{cont}$ can be disposed overlapping with the data lines extending along the second direction and at least partially covered by the data lines DL, as shown in FIG. 6A. Alternatively, the contacts $C_{cont}$ can also be positioned within the pixel regions (such as positioned under the pixel electrodes PE of the pixel regions), and the shapes of the data lines (e.g. DL) and the shapes of the semiconductor portions should be modified in corresponding to the positions of the contacts $C_{cont}$. FIG. 7 is a top view of another pixel design of a display apparatus according to the second embodiment of the disclosure, wherein a cross-sectional view of the display apparatus along the section line 6B-6B in FIG. 7 is identical to FIG. 6B. The details, such as the data lines DL' comprising the body portions 211 extending along the second direction D2 and the protruding portions 213 extending along the first direction D1, and the rectangular semiconductor portions described above (i.e. the contents related to FIG. 2A and FIG. 2B), are not redundantly repeated again.

Third Embodiment

Similar to the configurations and arrangement of the semiconductor portions in the second embodiment, two semiconductor portions corresponding to two pixel regions positioned adjacently along the first direction D1 (e.g. X-direction) of the third embodiment have the shapes upside down to each other in the second direction D2 (e.g. Y-direction), from a top view of the semiconductor portions. Compared to the conventional pixel design, the semiconductor portions of the third embodiment can be arranged more loosely, so that the gap(/distance) between two adjacent semiconductor portions can be enlarged. The difference between the second and third embodiments is the shape and size of the pixel electrodes of the pixel regions.

Embodiment 3-1

Figure 8B:
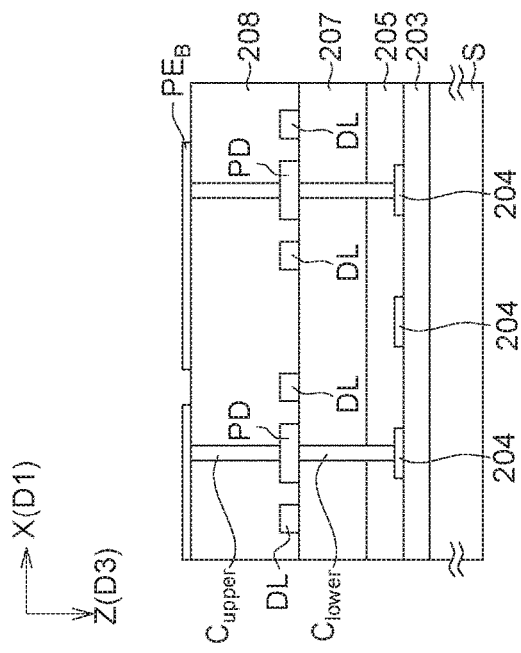
FIG. 8B is a cross-sectional view of the display apparatus along the section line 8B-8B in FIG. 8A.
Figure 8A:
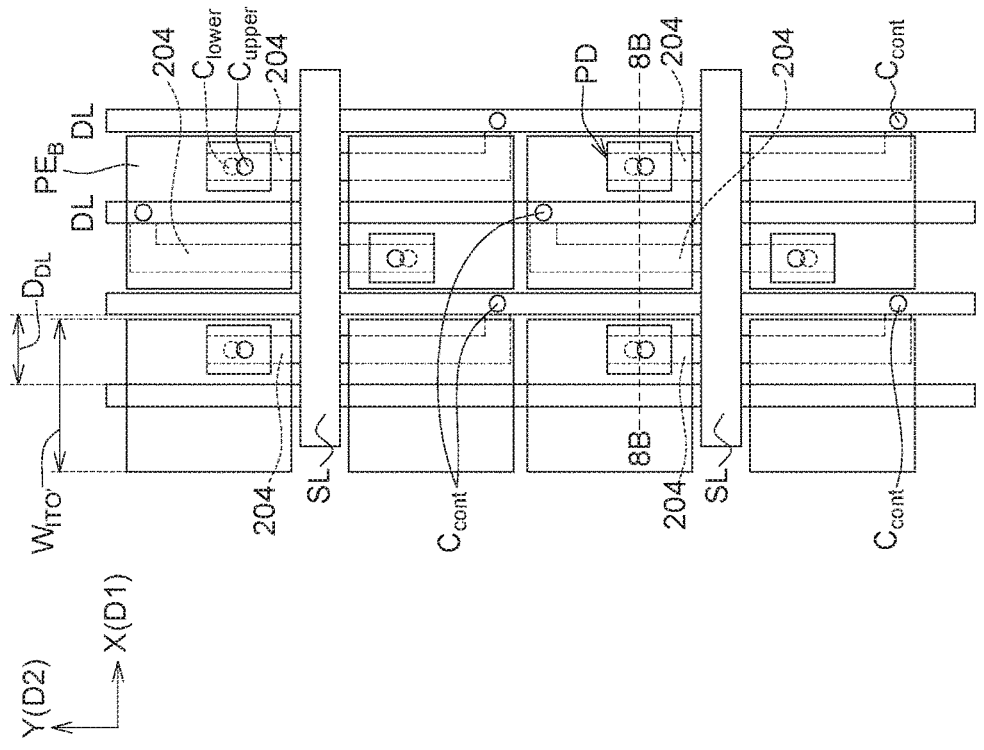
FIG. 8A is a top view of a pixel design of a display apparatus according to the third embodiment 3-1 of the disclosure.

FIG. 8A is a top view of a pixel design of a display apparatus according to the third embodiment 3-1 of the disclosure. FIG. 8B is a cross-sectional view of the display apparatus along the section line 8B-8B in FIG. 8A. The identical and/or similar elements of the embodiments in FIG. 8A-FIG. 8B, FIG. 6A-FIG. 6B and FIG. 1A-FIG. 1C are designated with the same and/or similar reference numerals, and the details have been described above and are not redundantly repeated. In third embodiment 3-1, the size of each pixel electrodes $PE_B$ is increased by crossing over adjacent data line DL. Thus, the pixel electrode $PE_B$ has a horizontally-extended rectangular shape. As shown in FIG. 8A, a width $W_{ITO}$ of each of the pixel electrodes $PE_B$ in the first direction D1 is larger than a distance $D_{DL}$ between adjacent two of the data lines DL for higher aperture ratio and/or against design rule error. In another embodiment, the width $W_{ITO'}$ of each of the pixel electrodes $PE_B$ is larger than 1.5 times the distance $D_{DL}$.

Embodiment 3-2

FIG. 9A is a top view of a pixel design of a display apparatus according to the third embodiment 3-2 of the disclosure. FIG. 9B is a cross-sectional view of the display apparatus along the section line 9B-9B in FIG. 9A. The identical and/or similar elements of the embodiments in FIG. 9A-FIG. 9B and FIG. 8A-FIG. 8B are designated with the same and/or similar reference numerals, and the element details have been described above and are not redundantly repeated. As shown in FIG. 9A, the pixel electrodes $PE_B$ of the pixel regions are arranged in a delta arrangement, which is good for displaying edges in many orientations so as to display smooth image.

Fourth Embodiment

FIG. 10A is a top view of a pixel design of a display apparatus according to the fourth embodiment of the disclosure. FIG. 10B is a cross-sectional view of the display apparatus along the section line 10B-10B in FIG. 10A. The identical and/or similar elements of the embodiments in FIG. 10A-FIG. 10B, FIG. 1A-FIG. 1C and FIG. 2A-FIG. 2B are designated with the same and/or similar reference numerals, and the details have been described above and are not redundantly repeated.

Similar to the pixel design of the first embodiment (e.g. FIG. 2A), a display apparatus of the fourth embodiment also comprises the first data lines DL1 and the second data lines DL2 fabricated from different conductive layers (or metal layers). In the fourth embodiment, the second data lines DL2 (e.g. fabricated from a first metal layer formed before a pattern of semiconductor portions) are positioned below and insulated from the first data lines DL1 (e.g. fabricated from the second metal layer). Also, adjacent two of the semiconductor portions 204 are electrically connected to the first data line DL1 and the second data line DL2 through a first contact C1 and a second contact C2, respectively. Therefore, from a top view of the substrate S, the second data line DL2 and the first data line DL1 positioned adjacently (along a normal direction of the substrate such as Z-direction in FIG. 10B) are at least partially overlapped. As shown in FIG. 10A, the first data line DL1 are overlapped with the second data line DL2 positioned adjacently (but the disclosure is not limited thereto).

Spatial arrangements and structural details of other elements in FIG. 10A-FIG. 10B, such as the gate lines SL, the third insulating layers 203, the gate insulating layer 205, the semiconductor portions 204, the first insulating layer 207, the protruding portions (213/223) and body portions (211/221) of data lines, the conductive pads PD, as well as the positions (including extending directions) and contact connections thereof (e.g. the lower contact $C_{lower}$ and the upper contact $C_{upper}$), can be referred to the same elements described above and those contents are not redundantly repeated here.

According to the fourth embodiment, the pixel design arranges the data lines at two different horizontal levels, such as the first data lines DL1 disposed on the first insulating layer 207, and the second data lines DL2 disposed between the substrate S and the gate insulating layer 205. In other words, the second data lines DL2 are positioned at a horizontal level lower than the horizontal level of the first data lines DL1. Compared to the conventional pixel design, the first data lines DL1 can be arranged more loosely. Therefore, a distance between two adjacent first data lines DL1 along the first direction D1 (e.g. X-direction) and a distance between two adjacent second data lines DL2 along the first direction D1 (e.g. X-direction) can be enlarged. Thus, the pixel design of the embodiment is particularly suitable for the display apparatus having pixels with small pixel pitch in the practical application. Also, the aperture ratio of the pixel design of the fourth embodiment is higher than that of the conventional pixel design because of the partially or fully overlapped first and second data lines.

Fifth Embodiment

FIG. 11 is a top view of a pixel design of a display apparatus according to the fifth embodiment of the disclosure. The identical and/or similar elements of the embodiments in FIG. 11 and FIG. 6A-FIG. 6B are designated with the same and/or similar reference numerals, and the details have been described above and are not redundantly repeated.

In the fifth embodiment, a display apparatus comprises plural semiconductor portions 204C (such as polysilicon portions) disposed on a substrate, plural gate lines SL disposed on the substrate (e.g. disposed above and insulated from the semiconductor portions 204C) and extending along the first direction D1 (e.g. X-direction), a first insulating layer covering the gate lines SL, plural data lines DL (e.g. disposed on the first insulating layer) spaced apart from each other and extending along the second direction D2 (e.g. Y-direction), plural conductive pads PD disposed on the first insulating layer, and a second insulating layer (not shown in FIG. 11) covering the data lines DL and the conductive pads PD. The data lines DL intersect with the gate lines SL (by crossing the gate lines SL) to define pixel regions. Similarly, one of the conductive pads PD (functioning as drain pads of TFT structures) is electrically connected to one of the pixel electrodes PE corresponding to one of the pixel regions through an upper contact $C_{upper}$, and electrically connected to the corresponding semiconductor portion 204C below through a lower contact $C_{lower}$.

In the fifth embodiment, the semiconductor portions 204C are electrically connected to the data lines DL correspondingly through the contacts $C_{c\text{-}cont}$. Thus, as shown in FIG. 11, the pixel electrodes PE corresponding to adjacent two of the pixel regions arranged along the second direction (e.g. Y-direction) are commonly connected to one of the semiconductor portions 204C. The loss of aperture ratio can be effectively improved by applying the contacts $C_{c\text{-}cont}$ (connecting the semiconductor portion 204C and the data line DL) commonly used by two pixels (or subpixlels).

Accordingly, the pixel design of the fifth embodiment also provides an effective way for reducing loss of the aperture ratio (e.g. occurred due to disarrangement of the LC molecules close to the contact) and design rule error. The pixel design of this embodiment is suitable for being applied to a display apparatus having pixels with small pixel pitch in the application.

Sixth Embodiment

FIG. 12A is a top view of a pixel design of a display apparatus according to the six embodiment of the disclosure. FIG. 12B is a cross-sectional view of the display apparatus along the section line 12B-12B in FIG. 12A. The identical and/or similar elements of the embodiments in FIG. 12A-FIG. 12B and FIG. 6A-FIG. 6B are designated with the same and/or similar reference numerals, and the details have been described above and are not redundantly repeated.

As shown in FIG. 12A and FIG. 12B, a display apparatus comprises a substrate S, plural semiconductor portions 204 (such as polysilicon portions) disposed on the substrate S, plural gate lines SL disposed on the substrate S (e.g. disposed above and insulated from the semiconductor portions 204 by gate insulating layer 205) and extending along the first direction D1 (e.g. X-direction), a first insulating layer 207 covering the gate lines SL, plural data lines DL disposed on the first insulating layer 207 and extending along the second direction D2 (e.g. Y-direction), and a second insulating layer 208 covering the data lines DL. The data lines DL intersect with the gate lines SL (by crossing the gate lines SL) to define pixel regions. The display apparatus of the sixth embodiment further comprise plural conductive pads $PD_{M3}$ (e.g. functioning as drain pads of TFT) disposed on the second insulating layer 208 and respectively corresponding to the pixel regions. Also, the conductive pads $PD_{M3}$ are covered by a fourth insulating layer 209. The data lines DL are electrically connected to the semiconductor portions 204 through the contact $C_{cont}$, respectively.

In the sixth embodiment, a pixel electrode PE corresponding to one of the pixel regions is electrically connected to one of the plurality of conductive pads $PD_{M3}$ correspondingly. For example, the pixel electrode PE is electrically connected to the conductive pad $PD_{M3}$ through an upper contact, $C_{upper}$. Also, in one of pixel region, a conductive pad $PD_{M3}$ is electrically connected to the semiconductor portion 204 through a lower contact, $C_{lower}$. That is, a conductive pad $PD_{M3}$ is provided for connecting the pixel electrode PE and the semiconductor portion 204. In another embodiment, the plurality of conductive pads $PD_{M3}$ could be disposed between the substrate S and gate insulating layer 205.

In the pixel design of the sixth embodiment, the conductive pads $PD_{M3}$ and the data lines DL are arranged in different horizontal levels, and this also provides a solution for reducing the distance between adjacent data lines of a display apparatus having pixels with small pixel pitch in the application.

<Applications>

Although only six embodiments are described above, the disclosure is not limited to those embodied pixel designs. Combinations of the exemplified embodiments are also feasible. There are some (not all) applications provided below, by combining the pixel designs in two or more embodiments for exemplifications. The identical and/or similar elements of the applications hereinafter and the embodiments described above are designated with the same and/or similar reference numerals for clear illustration, and the element details have been described above and are not redundantly repeated.

Figure 13:
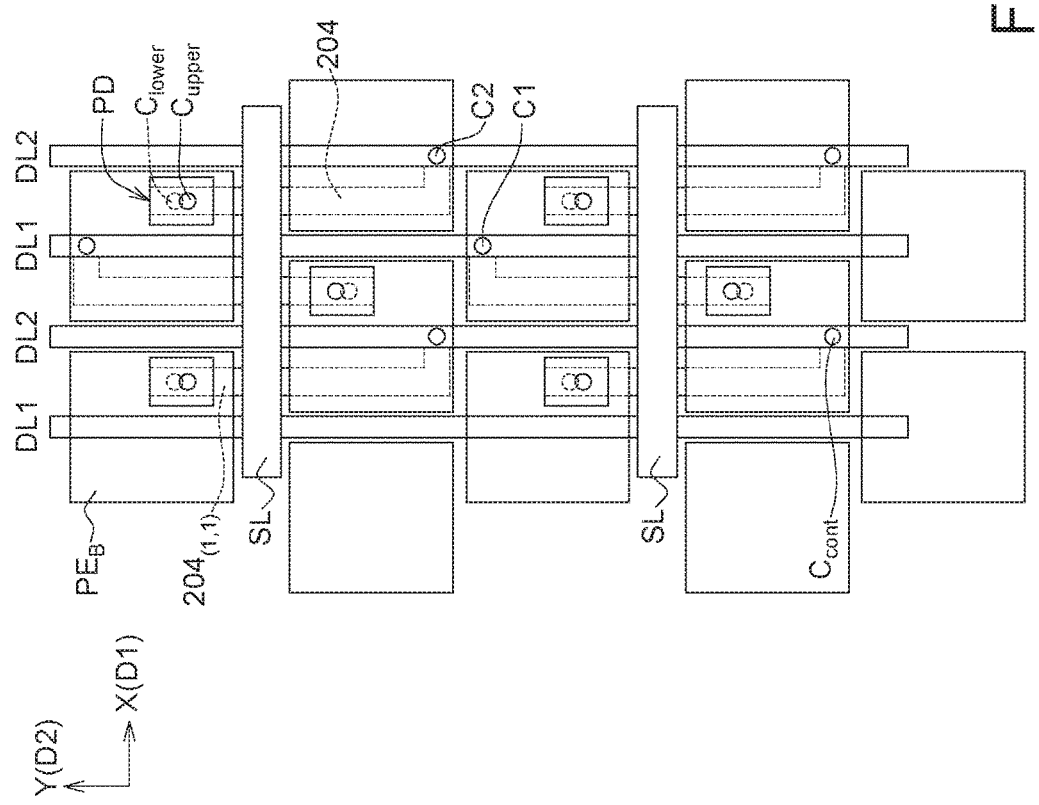
FIG. 13 is a top view of a pixel design of an embodied display apparatus of the disclosure according to the first application.

FIG. 13 is a top view of a pixel design of an embodied display apparatus of the disclosure according to the first application. In the first application, a pixel design is provided by combining the concepts of the first embodiment 1-1 (i.e. first data lines DL1 and the second data lines DL2 arranged alternately), the second embodiment (i.e. an alternated TFT/semiconductor portion arrangement for adjacent pixel regions along the first direction D1) and the third embodiment 3-2 (i.e. the horizontally-extended pixel electrodes $PE_B$ in a delta arrangement). Besides the advantages of the first application, the pixel design of FIG. 13 is good for displaying edges in many orientations so as to display smooth image.

Figure 14B:
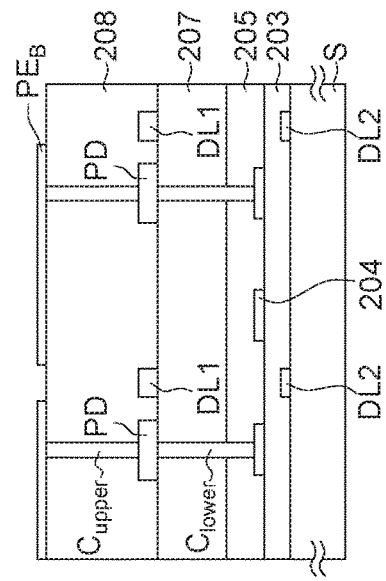
FIG. 14B is a cross-sectional view of the display apparatus along the section line 14B-14B in FIG. 14A.
Figure 14A:
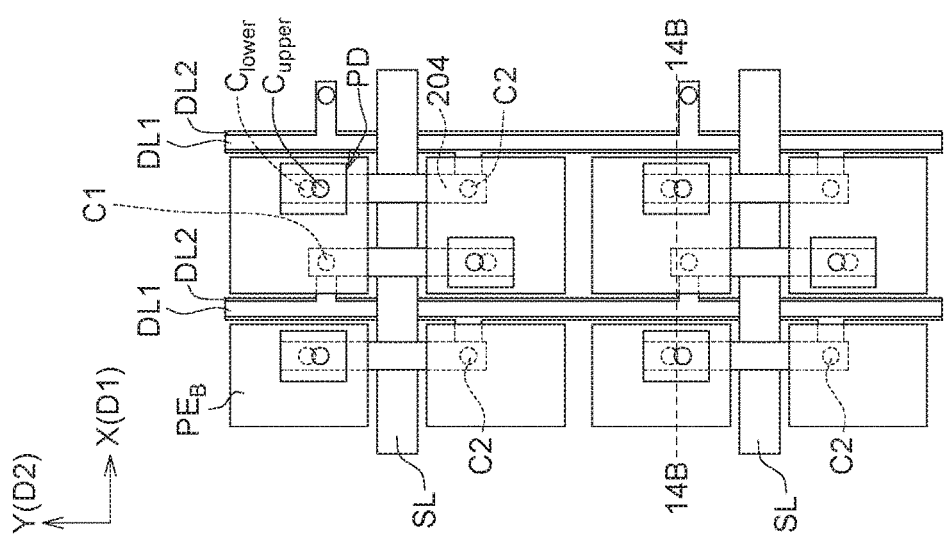
FIG. 14A is a top view of a pixel design of an embodied display apparatus of the disclosure according to the second application.

FIG. 14A is a top view of a pixel design of an embodied display apparatus of the disclosure according to the second application. FIG. 14B is a cross-sectional view of the display apparatus along the section line 14B-14B in FIG. 14A. In the second application, a pixel design is provided by combining the concepts of the second embodiment (i.e. an alternated TFT/semiconductor portion arrangement for adjacent pixel regions along the first direction D1), the third embodiment 3-1 (i.e. the horizontally-extended pixel electrodes $PE_B$) and the fourth embodiment (i.e. the second data line DL2 and the first data line DL1 positioned adjacently along a third-direction such as Z-direction being partially or fully overlapped). In this application, similar to the arrangement of the data lines (alternate DL2 and DL1) in the fourth embodiment, the gap(/distance) between two adjacent first data lines DL1 can be enlarged because of alternate arrangement of the data lines DL2 and DL1 in the different horizontal levels. Also, the pixel design of FIG. 14A has higher aperture ratio due to the expanded pixel electrodes $PE_B$ and the first data lines D1 overlapped with the second data lines D2. Thus, the pixel design of the second application is suitable for being applied to a display apparatus having pixels with small pixel pitch.

Figure 15B:
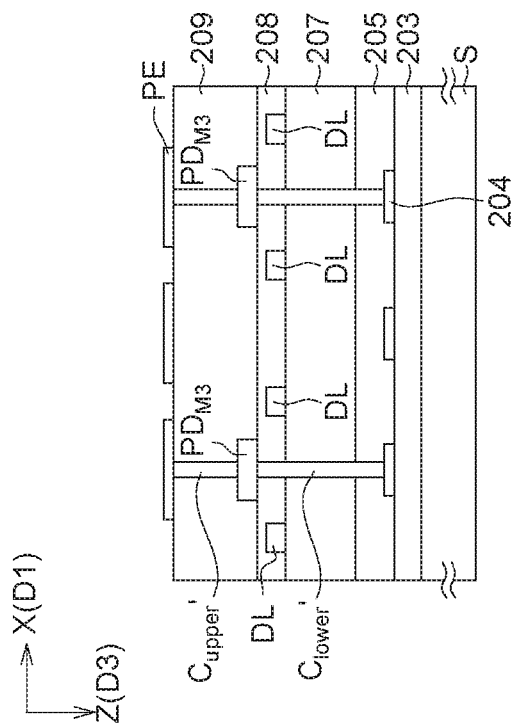
FIG. 15B is a cross-sectional view of the display apparatus along the section line 15B-15B in FIG. 15A.
Figure 15A:
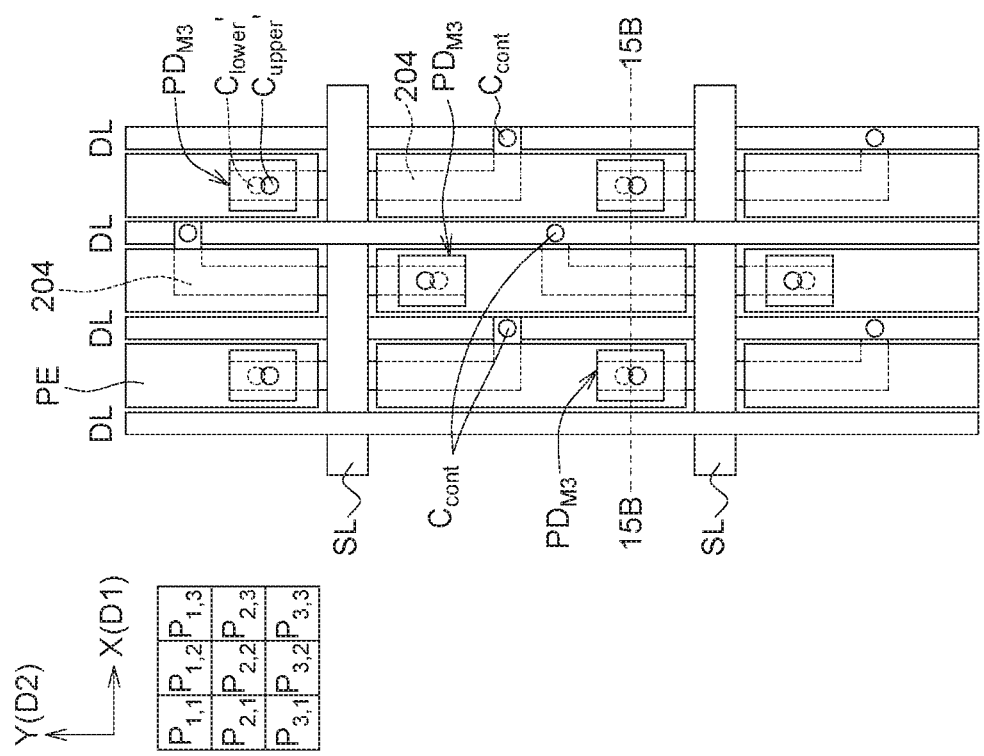
FIG. 15A is a top view of a pixel design of an embodied display apparatus of the disclosure according to the third application.

FIG. 15A is a top view of a pixel design of an embodied display apparatus of the disclosure according to the third application. FIG. 15B is a cross-sectional view of the display apparatus along the section line 15B-15B in FIG. 15A. In the third application, a pixel design is provided by combining the concepts of the second embodiment (i.e. an alternated TFT/semiconductor portion arrangement for adjacent pixel regions along the first direction D1) and the sixth embodiment (i.e. a conductive pad $PD_{M3}$ is provided for connecting the pixel electrode PE and the semiconductor portion 204). In this application, the conductive pads $PD_{M3}$ and the data lines DL are arranged in different horizontal levels, and the alternated arrangement of semiconductor portions 204 with different shapes, thereby effectively reducing the distance between adjacent data line DL and conductive pad $PD_{M3}$ of a display apparatus. Thus, the third application is suitable for being applied to a display apparatus having pixels with small pixel pitch.

Although the embodiments and the exemplified applications above are related to a LTPS (i.e. low temperature polysilicon) structure, it is noted that the disclosure is not limited to the LTPS types of displays. The embodiments of the disclosure can also be applied to other types of displays, such as the display having a-Si TFT structures or oxide (e.g. IGZO) TFT structures. FIG. 16A is a top view of a pixel design of an embodied display apparatus of the disclosure according to the fourth application, wherein the embodied display apparatus has a-Si TFT structures. FIG. 16B is a cross-sectional view of the display apparatus along the section line 16B-16B in FIG. 16A. FIG. 16C is a cross-sectional view of the display apparatus along the section line 16C-16C in FIG. 16A. In the fourth application, the pixel design of the first embodiment 1-2 (i.e. first data lines DL1 and the second data lines DL2' arranged alternately) is adopted into a pixel design of a display apparatus having a-Si TFT structures. As shown in FIG. 16A, the source electrodes SE and the drain electrodes DE are formed on the semiconductor portions 284 (e.g., a-Si portions). The first data lines DL1 are electrically connected to the semiconductor portion 284 (e.g., a-Si portions), and the drain electrodes DE are electrically connected to the pixel electrodes PE through the contacts $C_5$. Compared to a conventional a-Si TFT display, the configurations and arrangement of the data lines (alternate DL2' and DL1) in different horizontal levels of the first embodiment 1-2, the gap(/distance) between two adjacent first data lines DL1 of the display apparatus having a-Si TFT structures can be effectively enlarged.

According to the aforementioned descriptions, the embodiments provide pixel designs suitable for being applied to a display apparatus having pixels with small pixel pitch. It is noted that the technique features described in one embodiment are not limited to the application of that embodiment. Structural details of the aforementioned embodiments are provided for exemplification only, not for limitation. It is, of course, noted that the features of different embodiments can be combined and rearranged without departing from the spirit and scope of the present disclosure. Other embodiments with different configurations, such as change on components of the related layers and the displaying elements to meet practical requirements can be applicable. It is known by people skilled in the art that the configurations and the procedure details of the related components/layers could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A display apparatus, comprising:
a substrate;
a gate line, disposed on the substrate and extending along a first direction;
a gate insulating layer, covering the gate line;
a first data line, disposed on the gate insulating layer and extending along a second direction, wherein the second direction is different from the first direction;
a first insulating layer, covering the first data line;
a second data line, disposed between the substrate and the gate insulating layer, or disposed on the first insulating layer, wherein the second data line extends along the second direction, and both of the first data line and the second data line intersect with the gate line; and
semiconductor portions disposed on the substrate, wherein adjacent two of the semiconductor portions are electrically connected to the first data line and the second data line through a first contact and a second contact, respectively.

2. The display apparatus according to claim 1, further comprising pixel regions, wherein the first data line and the second data line are corresponding to adjacent two of the pixel regions disposed along the first direction, respectively.

3. The display apparatus according to claim 1, wherein the first contact is at least partially overlapped with the first data line.

4. The display apparatus according to claim 1, wherein the second contact is at least partially overlapped with the second data line.

5. The display apparatus according to claim 1, further comprising pixel regions, wherein the first data line comprises:
a first body portion, extending along the second direction; and
at least one first protruding portion, extending along a third direction and connected to the first body portion, the third direction different from the second direction, and the at least one first protruding portion positioned within one of the pixel regions correspondingly, wherein the first contact is electrically connected to the at least one first protruding portion.

6. The display apparatus according to claim 1, further comprising pixel regions, wherein the second data line comprises:
- a second body portion, extending along the second direction; and
- at least one second protruding portion, extending along a third direction and connected to the second body portion, the third direction different from the second direction, and the at least one second protruding portion positioned within one of the pixel regions correspondingly, wherein the second contact is electrically connected to the at least one second protruding portion.

7. The display apparatus according to claim 1, further comprising at least one conductive pad electrically connected to at least one of the semiconductor portions, and the at least one conductive pad is disposed between the substrate and the gate insulating layer, or disposed on the first insulating layer.

8. The display apparatus according to claim 1, wherein from a top view of the substrate, the second data line and the first data line are at least partially overlapped.

* * * * *